US012617187B2

(12) United States Patent
Borini et al.

(10) Patent No.: US 12,617,187 B2
(45) Date of Patent: May 5, 2026

(54) MULTILAYER FILM FOR PACKAGING AND METHOD OF MANUFACTURE THEREOF

(71) Applicant: TORAPHENE LIMITED, Exmouth (GB)

(72) Inventors: Stefano Borini, London (GB); Malik Qasim, London (GB); Simon Broughton, London (GB)

(73) Assignee: TORAPHENE LIMITED, Exmouth (GB)

( * ) Notice: Subject to any disclaimer, the term of this patent is extended or adjusted under 35 U.S.C. 154(b) by 0 days.

(21) Appl. No.: 18/655,633

(22) Filed: May 6, 2024

(65) Prior Publication Data

US 2024/0286388 A1     Aug. 29, 2024

Related U.S. Application Data

(62) Division of application No. 16/617,087, filed as application No. PCT/EP2018/063861 on May 28, 2018, now Pat. No. 11,975,509.

(30) Foreign Application Priority Data

May 26, 2017     (GB) ..................................... 1708517

(51) Int. Cl.
*B32B 23/08*     (2006.01)
*B32B 23/18*     (2006.01)
(Continued)

(52) U.S. Cl.
CPC ............. *B32B 23/08* (2013.01); *B32B 23/18* (2013.01); *B32B 27/08* (2013.01); *B32B 27/36* (2013.01);
(Continued)

(58) Field of Classification Search
CPC ......... B32B 23/08; B32B 23/18; B32B 27/08;
B32B 27/36; B32B 37/24; B32B 38/145;
B32B 2037/243; B32B 2250/40; B32B
2255/10; B32B 2264/108; B32B
2307/4023; B32B 2307/732; B32B
2439/70; B32B 2255/26; B32B 23/14;
B32B 2250/24; B32B 2367/00; B32B
2439/00; B65D 65/42; C09D 5/00; C09D
11/52; C23C 14/02; H01B 13/0026;
B41N 1/00
See application file for complete search history.

(56) References Cited

U.S. PATENT DOCUMENTS

| | | | | | |
|---|---|---|---|---|---|
| 2007/0284557 | A1* | 12/2007 | Gruner | ................... | B82Y 30/00 |
| | | | | | 252/500 |
| 2011/0088931 | A1* | 4/2011 | Lettow | ................... | D21H 19/10 |
| | | | | | 428/476.3 |

FOREIGN PATENT DOCUMENTS

| | | | | | |
|---|---|---|---|---|---|
| CN | | 105118382 | A | * 12/2015 | ............... G09F 9/00 |

OTHER PUBLICATIONS

Pierleoni et al., "Graphene-based coatings on polymer films for gas barrier applications", Carbon, vol. 96, pp. 503-512, available online Sep. 2015. (Year: 2015).*

* cited by examiner

*Primary Examiner* — Christopher W Raimund
(74) *Attorney, Agent, or Firm* — Ziegler IP Law Group, LLC.

(57)     ABSTRACT

Disclosed is a multilayer film for packaging. The multilayer film has a layer of ink and an adjacent layer of substrate. The layer of ink includes functionalised graphene and a material selected from cellulose, polylactic acid and a polyhydroxy-alkanoate.

8 Claims, 2 Drawing Sheets

(51) Int. Cl.

| | |
|---|---|
| *B32B 27/08* | (2006.01) |
| *B32B 27/36* | (2006.01) |
| *B32B 37/24* | (2006.01) |
| *B32B 38/00* | (2006.01) |
| *B41N 1/00* | (2006.01) |
| *B65D 65/42* | (2006.01) |
| *C09D 5/00* | (2006.01) |
| *C09D 11/52* | (2014.01) |
| *C23C 14/02* | (2006.01) |
| *H01B 13/00* | (2006.01) |

(52) U.S. Cl.

CPC ............ *B32B 37/24* (2013.01); *B32B 38/145* (2013.01); *B65D 65/42* (2013.01); *C09D 5/00* (2013.01); *C09D 11/52* (2013.01); *C23C 14/02* (2013.01); *H01B 13/0026* (2013.01); *B32B 2037/243* (2013.01); *B32B 2250/40* (2013.01); *B32B 2255/10* (2013.01); *B32B 2264/108* (2013.01); *B32B 2307/4023* (2013.01); *B32B 2307/732* (2013.01); *B32B 2439/70* (2013.01); *B41N 1/00* (2013.01)

MULTILAYER FILM FOR PACKAGING AND METHOD OF MANUFACTURE THEREOF

TECHNICAL FIELD

The present disclosure relates generally to packaging material; and more specifically, to multilayer film for packaging. Moreover, the present disclosure is concerned with methods of manufacturing aforesaid multilayer film for packaging.

BACKGROUND

Typically, packaging plays an indispensable part in storage and transportation of goods. Consequently, the role of packaging films is significant. Generally, packaging films protect the goods from damages from environmental factors such as pollution, rain and moisture, and from damages during transportation such as wear and tear, breakage and so forth. Furthermore, packaging films may assist in identification of the goods. Additionally, when used for food packaging, packaging films may isolate the food from external environment and prevent oxidation thereof.

Conventionally, packaging films employ metals and polymers for protection of goods. Generally, metals are employed to provide mechanical robustness to the packaging films. Additionally, polymers, specifically, thermoplastics such as polypropylene or polyethylene terephthalate are employed to provide a barrier layer between the goods and external environment. Furthermore, a combination of metals, such as aluminium, and polymers may be employed in packaging films. Such combination packaging films provide superior mechanical robustness and isolation of goods. However, recycling of such combination films may be difficult.

Generally, use of metals or polymers in packaging films does not provide desirable protection of the goods from external damage. With increase in environmental awareness, use of non-recyclable packaging films has been a growing concern. Additionally, use of metals may significantly increase weight of the packaging film. Consequently, increased weight of the packaging film may lead to difficulty in handling and higher transportation costs. Furthermore, conventional packaging films are mechanically weak and may be subject to wear and tear.

Therefore, in light of the foregoing discussion, there exist problems associated with conventional packaging films.

SUMMARY

The present disclosure seeks to provide an improved multilayer film for packaging.

The present disclosure also seeks to provide an improved method of manufacturing a multilayer film for packaging.

According to a first aspect there is provided a multilayer film for packaging comprising:

a layer of ink comprising functionalised graphene and a material selected from cellulose, polylactic acid and a polyhydroxyalkanoate; and an adjacent layer of substrate deposited with the layer of ink.

The present disclosure seeks to provide an improved, recyclable, light-weight multilayer film for packaging; moreover, employs functionalised graphene to provide higher mechanical robustness to the multilayer film.

Optionally, the multilayer film further including a second layer of substrate such that the layer of ink is sandwiched between the layers of substrate.

Optionally, the multilayer film further including a second layer of ink between the second layer of substrate and the layer of ink. Optionally, the functionalised graphene includes at least one of a functional group: aliphatic ester, aromatic ester, amine, epoxide, carboxyl, hydroxyl, siloxanes, silanes.

Optionally, concentration of the material selected from cellulose, polylactic acid and a polyhydroxyalkanoate mixed with the functionalised graphene may be in a range of 0.5 to 20 weight %.

Optionally, the substrate is polyethylene terephthalate.

According to a second aspect, there is provided a method for manufacturing a multilayer film for packaging, the method comprising:

providing functionalised graphene;

mixing the functionalised graphene with a material selected from cellulose, polylactic acid and a polyhydroxyalkanoate;

dispersing the mixture of the functionalised graphene and the material in a solvent to form an ink; and depositing a layer of ink on a layer of substrate to form the multilayer film.

Optionally, the method further includes applying a second layer of substrate on the deposited layer of ink to sandwich the deposited layer of ink between the layers of substrate.

Optionally, the method includes depositing a second layer of ink between the second layer of substrate and the deposited layer of ink.

More optionally, the method includes arranging for each of the layers of ink and each of the layers of substrate to include a thickness in a range of 1 nanometres to 10 micrometres and a thickness in a range of 10 micrometres to 500 micrometres, respectively Optionally, the method includes arranging for the functionalised graphene to include at least one of a functional group: aliphatic ester, aromatic ester, amine, epoxide, carboxyl, hydroxyl, siloxanes, silanes.

Optionally, the method includes treating the substrate prior to deposition of the layer of ink thereon.

Optionally, the method includes treating the substrate includes at least one of: functionalizing, washing, coating.

More optionally, the depositing the layer of ink on the layer of substrate is implemented by one of: spin-coating, bar-spreading or spraying.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

In overview, embodiments of the present disclosure are concerned with an improved multilayer film for packaging of goods.

In first aspect there is provided a multilayer film 100 for packaging including a layer of ink 102 and an adjacent layer of substrate 104. The layer of ink further includes a functionalised graphene and material selected from cellulose, polylactic acid and a polyhydroxyalkanoate.

Figure 1:
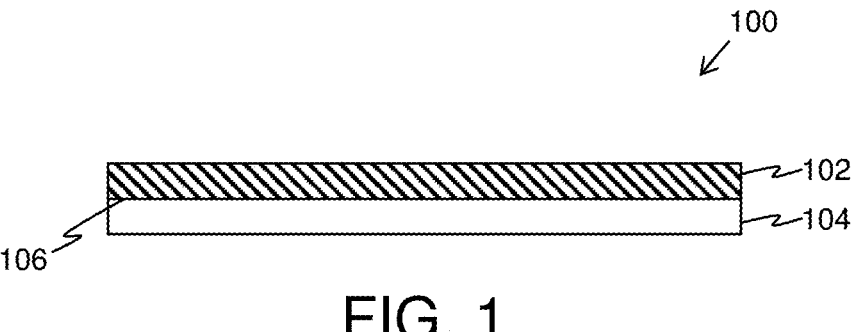
FIGS. 1-3 are schematic illustrations of a multilayer film, in accordance with various embodiments of the present disclosure.

Now referring to FIG. 1, there is shown a schematic illustration of a multilayer film 100 for packaging, in accordance with an embodiment of the present disclosure. As shown, the multilayer film 100 comprises a layer of ink 102, and an adjacent layer of substrate 104 deposited with the layer of ink 102. Specifically, the layer of ink 102 is deposited on the surface 106 of the layer of substrate 104.

Furthermore, the ink is formed by providing functionalised graphene, mixing the functionalised graphene with material selected from cellulose, polylactic acid and a polyhydroxyalkanoate and dispersing the mixture of functionalised graphene and material selected from cellulose, polylactic acid and a polyhydroxyalkanoate in a solvent. Specifically, the mixture of functionalised graphene and cellulose may provide high-strength, complex, fibrous layer of ink on the layer of substrate, such as the layer of ink 102 on the layer of substrate 104. Additionally, the solvent may provide an ease of deposition of the dispersed mixture of functionalised graphene and material selected from cellulose, polylactic acid and a polyhydroxyalkanoate on the layer of substrate.

Optionally, graphene may be synthesised by one of the synthesis techniques: mechanical cleaving, chemical exfoliation, chemical synthesis or chemical vapour deposition. In an example, the synthesis technique employed to synthesise graphene may be mechanical cleaving. In such example, graphite or graphite oxide is mechanically exfoliated to obtain graphene sheets. In another example, the graphene may be synthesized by chemical vapour deposition. In such example, methane and hydrogen are reacted on a metal surface at high temperatures to deposit sheets of graphene thereon. In yet another example, chemical synthesis may be employed to obtain graphene by synthesizing graphene and subsequently reducing with hydrazine. Furthermore, the properties and structure of graphene may depend on the technique employed for synthesis. Additionally, the chemical vapour deposition technique may be employed to obtain graphene sheets with least amount of impurities. Optionally, synthesised graphene may be functionalised with a functional group to enhance its properties and improve its interactability with the substrate.

Optionally, the functionalised graphene may include at least one of a functional group: aliphatic ester, aromatic ester, amine, epoxide, carboxyl, hydroxyl, siloxanes, silanes. More optionally, the functionalised group may include graphite oxide. Furthermore, the synthesized graphene may be reacted with a suitable compound to obtain functionalised graphene. Additionally, each of the carbon atoms in the synthesised graphene comprises a delocalised electron. Consequently, the functional group may react with the carbon atoms thereof. In an example, the functionalised graphene may include functional groups, epoxide and carboxylic acid. In addition, the functional groups of the functionalised graphene may influence the properties thereof.

The graphene may be mixed with a material selected from cellulose, polylactic acid or a polyhydroxyalkanoate. The polylactic acid optionally has a weight average molecular weight on the range 30 kdalton to 400 kdalton, to achieve the desired flexibility of the packaging material. The polyhydroxyalkanoate optionally has a weight average molecular weight on the range 30 kdalton to 400 kdalton, to achieve the desired flexibility of the packaging material. The polyhydroxyalkanoate is optionally selected from polyhydroxyvalerate and polyhydroxybutyrate. Cellulose, polylactic acid and polyhydroxyalkanoate confer strength and biodegradability to the packaging material.

It will be appreciated that the functionalised graphene may be mixed with cellulose to implement a nano-fibrous layer of functionalised graphene interspersed with cellulose on the layer of substrate. Additionally, the presence of cellulose with functionalised graphene further increases the strength of the layer of ink deposited on the substrate, such as the layer of ink 102 on the layer of substrate 104.

Furthermore, the presence of cellulose may assist adhesion of the layer of ink on the layer of substrate.

Optionally, the solvent may include one of a: polar solvent, a non-polar solvent. Specifically, the solvent employed may be based on the type of functional group of the functionalised graphene. More specifically, the nature of the solvent may determine the dispersion characteristics of the mixture of the functionalised graphene and material selected from cellulose, polylactic acid and a polyhydroxyalkanoate. In an example, the solvent employed may be a polar solvent such as water or ethanol. In such example, the functional group of the functionalised graphene may be polar functional group such as carboxyl or amine.

Optionally in another example, the solvent employed may be a non-polar solvent such as benzene or diethyl ether. In such example, the functional group of the functionalised graphene may be non-polar functional group such as an aliphatic hydrocarbon. Furthermore, the solvent may assist deposition of the layer of ink on the layer of substrate. Additionally, the solvent may vaporise after deposition of the layer of ink on the layer of substrate.

Optionally, the solvent further includes a binder. More optionally, the binder may enhance the adhesive properties of the layer of ink on the layer of substrate. Furthermore, the binder may be added to solvent prior to dispersion of mixture of functionalised graphene and material selected from cellulose, polylactic acid and a polyhydroxyalkanoate thereof. Additionally, nature and/or functional group of the binder may be compatible and/or similar to the functionalised graphene.

Optionally, the binder includes an organic compound. More optionally, an organic binder may facilitate bond formation between an organic solvent and the functionalised graphene. Examples of the binder may include but, are not limited to, natural and synthetic rubbers, alkane polymers, alkene polymers, polyamides, polyurethanes and so forth. More optionally, the binder may be compatible with the solvent and the functional group of the functionalised graphene to enable interaction therebetween.

Optionally, concentration of the solvent may be in a range of 80 to 99.5 weight %. More optionally, the concentration of the material selected from cellulose, polylactic acid and a polyhydroxyalkanoate mixed with the functionalised graphene may be in a range of 0.5 to 20 weight %.

In an example, 80/20 weight % solution of pine oil/material selected from cellulose, polylactic acid and a polyhydroxyalkanoate can be prepared and then used to make a 2.5 weight % dispersion of graphene material.

Optionally the depositions of the layer of ink on the layer of substrate may be implemented in the temperature range of 50° to 120° C.

Optionally, the substrate is polyethylene terephthalate. Specifically, the polyethylene terephthalate substrate is a flexible, thermoplastic polymer.

More optionally, the substrate may be a flexible, transparent material. Yet more optionally, the substrate may be a flexible, translucent material. Examples of the substrate may include, but are not limited to, elastomers, fabrics, ceramics, paper, rubbers and so forth.

Figure 2:
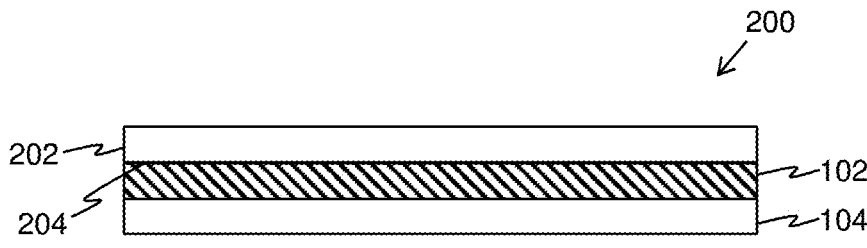

Referring to FIG. 2, there is shown a schematic illustration of a multilayer film 200, in accordance with an embodiment of the present disclosure. Optionally, the multilayer film 200 may include a second layer of substrate 202 applied on the layer of ink 102 such that the layer of ink 102 is sandwiched in between the layers of substrate 202 and 104. Furthermore, the deposited layer of ink 102 may be in contact with surface 204 of the second layer of substrate 202.

Optionally, the second layer of substrate 202 may be applied to the deposited layer of ink 102 to further improve strength of the multilayer film 200. Specifically, the second layer of substrate 202 may prevent any undesirable components from contacting the deposited layer of ink 102. More specifically, the undesirable components may be dirt, pollutants and so forth. Furthermore, the deposited layer of ink may adhere to the surface 204 of the second layer of substrate 202. Consequently, physical properties of the multilayer film 200 may be improved significantly by the second layer of substrate 202. Particularly, the second layer of substrate 202 prevent any undesirable components from contacting the deposited layer of ink 102 and thereby prevents the multilayer film 200 from deterioration. More particularly, the second layer of substrate 202 applied on the deposited layer of ink 102 to sandwich the deposited layer of ink 102 between the layers of substrate 202 and 104 helps in better handling and gripping of the multilayer film 200.

Optionally, the substrate 104 may be treated prior to deposition of the layer of ink 102 thereon. More optionally, the second layer of substrate 202 may be treated prior to application on the deposited layer of ink 102. Specifically, the layers of substrate 104 and 202 may be treated to improve adhesion of the deposited layer of ink 102 thereon.

Optionally, treating the substrate includes at least one of: functionalizing, washing, coating. More optionally, the substrate 104 and 202 may be treated to further improve its physical properties and ensure adhesion of the deposited layer of ink 102 thereon. In an example, the substrate may be washed prior to deposition of layer of ink thereon. Specifically, in such example, the substrate may be washed with chemical compound to remove any undesirable elements present on the surface thereof.

More optionally, the substrate may be functionalised with a functional group, similar to the functional group of the functionalised graphene provided in the layer of ink. Specifically, the functional group of the substrate may interact with the functional group of the functionalised graphene. More specifically, the interaction may include Vander-Walls attraction, hydrogen bonding, interaction and so forth. In an example, the functional group of the functionalised graphene may be dodecyl-amine. In such example, the substrate may be functionalised with a dodecyl-amine functional group. Alternatively, in such example, the substrate may be functionalised with a functional group similar to the dodecyl-amine. Specifically, functionalising the substrate with the functional group of the functionalised graphene is advantageous in terms of providing enhanced bonding between functionalised substrate and functionalised graphene and thereby, increases the adhesion between functionalised substrate and functionalised graphene.

Optionally, the substrate may be coated with a material to improve physical and/or aesthetic properties of the substrate. More optionally, the material may be a paint, varnishes and so forth. Additionally, or alternatively optionally, the material may be electrically and/or thermally conductive. Yet more optionally, the material may comprise a complex structure to further reduce permeability of the multilayer film. Furthermore, the coating may comprise prints, patterns or watermarks for advertisement or identification purposes.

Figure 3:
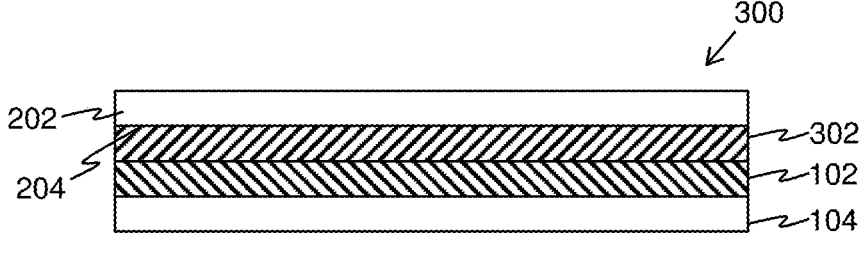

Referring to FIG. 3, there is shown a schematic illustration of a multilayer film 300, in accordance with another embodiment of the present disclosure. Optionally, the multilayer film 300 includes a second layer of ink 302 deposited between the second layer of substrate 202 and the deposited layer of ink 102. Furthermore, the second layer of ink 302 may be deposited on the surface 204 of the second layer of substrate 202. Additionally, the second layer of ink 302 may be in contact with the deposited layer of ink 102. The multilayer film 300 includes the second layer of ink 302 deposited between the second layer of substrate 202 and the deposited layer of ink 102. Further, the use of second layer of ink 302 is advantageous in terms of providing robustness and ruggedness to the multilayer film 300 used for packaging.

Optionally, the functionalised graphene in the second layer of ink 302 may comprise a functional group. Furthermore, the functional group of the functionalised graphene in the second layer of ink 302 may interact with the second layer of substrate 202. As aforementioned, the second layer of substrate may be treated to provide a functionalization. Specifically, the functional group of the second layer of substrate 202 may selected to facilitate interaction therebetween.

More optionally, the functionalised graphene in the second layer of ink 302 may interact with the deposited layer of ink 102. In an example, the interaction may include hydrogen bonding or Vander-Walls attraction or π-π interaction. In another example, the interaction may include reaction between the functionalised graphene in layers of ink 102 and 302. Optionally, carbon atoms of the functionalised graphene, in layers of ink 102 and 302, may share the delocalised fourth electron to form a covalent bond therebetween. More optionally, the functional groups of the functionalised graphene, in layers of ink 102 and 302, may react to form bonds, such as covalent or ionic bonds, therebetween.

Optionally, each of the layers of ink, such as the layers of ink 102 and 302, and each of the layers of substrate, such as the layers of substrate 104 and 202, may include a thickness in a range of 1 nanometre to 10 micrometres and a thickness in a range of 10 micrometres to 500 micrometres, respectively.

Optionally, depositing the layer of ink, such as the layers of ink 102 and 302, on the layer of substrate, such as the layers of substrate 104 and 202, may be implemented by one of: spin-coating, bar spreading or spraying. In an example, the depositing of layer of ink may be deposited by spin-coating. Specifically, in such example, the ink may be deposited near the centre of substrate. Subsequently, the substrate may be rotated at high-speeds to spread the ink evenly thereon. In another example, the layer of ink may be deposited by bar-spreading. In such example, the ink is deposited on the substrate and subsequently spread on the substrate using a bar-spreader. In yet another example, the ink may be sprayed directly on the substrate. In an example, the substrate may be heated and kept at a temperature in the range of 50° to 120° C. during the spraying. Furthermore, the technique employed for deposition of ink on the substrate may be selected based on the thickness of the layer of ink required on the substrate.

Figure 4:
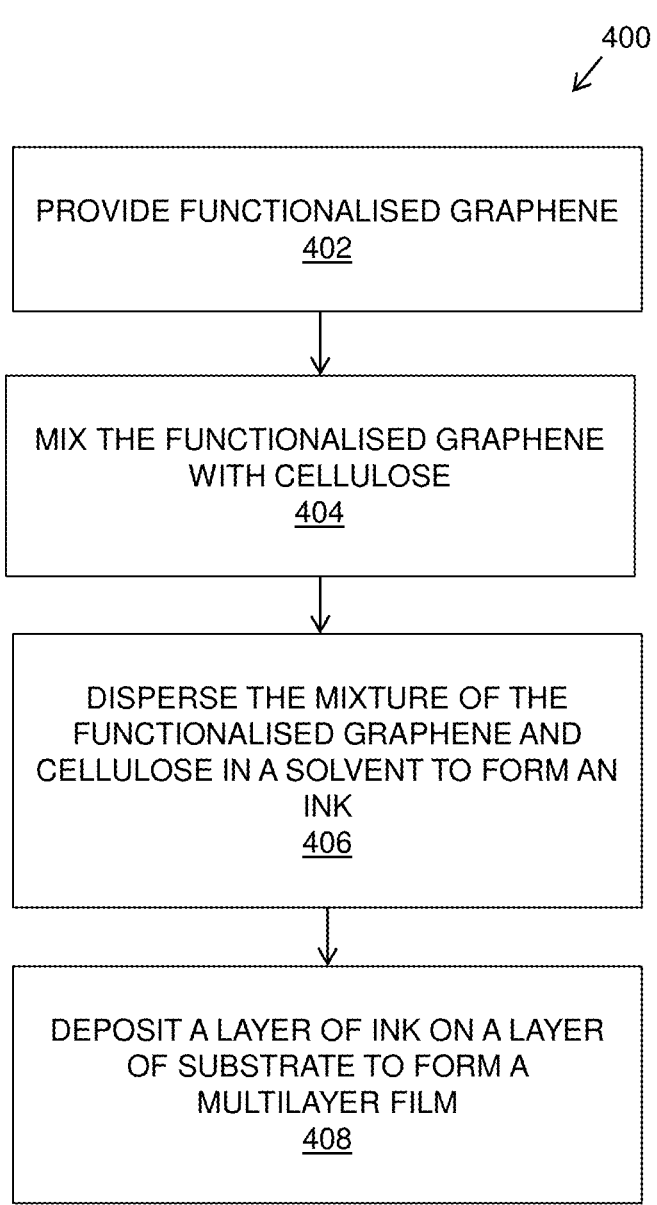
FIG. 4 is an illustration of steps of a method for manufacturing a multilayer film for packaging, in accordance with an embodiment of the present disclosure.

Referring to FIG. 4, there is shown an illustration of steps of a method 400 for manufacturing a multilayer film for packaging, in accordance with an embodiment of the present disclosure. At a step 402, functionalised graphene is provided. At a step 404, the functionalised graphene is mixed with material selected from cellulose, polylactic acid and a polyhydroxyalkanoate. At a step 406, the mixture of the functionalised graphene and material selected from cellulose, polylactic acid and a polyhydroxyalkanoate are dispersed in a solvent to form an ink. At step 408, a layer of ink is deposited on a layer of substrate to form the multilayer film.

The steps 402 to 410 are only illustrative and other alternatives can also be provided where one or more steps are added, one or more steps are removed, or one or more steps are provided in a different sequence without departing from the scope of the claims herein. Optionally, the method further includes applying a second layer of substrate on the deposited layer of ink to sandwich the deposited layer of ink between the layers of substrate. Optionally, the method includes depositing a second layer of ink between the second layer of substrate and the deposited layer of ink. More optionally, the method includes arranging for the functionalised graphene to include at least one of a functional group: aliphatic ester, aromatic ester, amine, epoxide, carboxyl, hydroxyl, siloxanes, silanes.

Optionally, each of the layers of ink (102, 302) and each of the layers of substrate (104, 202) includes a thickness in a range of 1 nanometres to 10 micrometres and a thickness in a range of 10 micrometres to 500 micrometres, respectively. Specifically, using the adjacent layer of substrate having thickness more than the thickness of each of the layers of ink is advantageous in terms of providing a surface for printing on the layer of substrate which can be used for identification, labelling and providing aesthetics to the multilayer film for packaging.

Optionally, the method includes arranging for the solvent to include one of a: polar solvent, non-polar solvent. Optionally, the method includes arranging for the solvent to further include a binder. Optionally, the method includes arranging for the binder to include an organic compound.

Optionally, the method includes treating the substrate prior to deposition of the layer of ink thereon. Optionally, the method includes treating the substrate includes at least one of: functionalizing, washing, coating. More optionally, the depositing the layer of ink on the layer of substrate is implemented by one of: spin-coating, bar-spreading or spraying.

Optionally, the method includes lamination of the two substrates with the two layers of inks on top, pressing and heating at a temperature in the range of 60° to 180° C. to favour the interaction between the two layers of ink.

The multilayer film of the present disclosure provides many benefits and an improved and recyclable multilayer film. The multilayer film employs functionalised graphene mixed with material selected from cellulose, polylactic acid and a polyhydroxyalkanoate deposited on a substrate. Optionally, the multilayer film comprises nano-fibrous structure on the surface thereof. Beneficially, the film is lightweight and flexible. Furthermore, the multilayer film is highly impermeable and provides an efficient barrier layer between goods and external environment. Additionally, the multilayer film has high mechanical strength and resiliency. Beneficially, the multilayer film may efficiently protect the goods from wear and tear, and damage. Furthermore, the substrate of the multilayer film is customizable and may be used for advertisement and identification purposes.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

The invention claimed is:

1. A multilayer film for packaging comprising:
   a first layer of substrate comprising a first layer of ink deposited on a surface of the first layer of substrate,
   a second layer of substrate comprising a second layer of ink deposited on a surface of the second layer of substrate,
   wherein the first layer of ink and the second layer of ink comprise functionalized graphene and cellulose interspersed,
   wherein the first layer of substrate and the second layer of substrate have functional groups that interact with a functional group of the functionalized graphene;
   wherein the first layer of ink and the second layer of ink are nano-fibrous structures formed by the functionalized graphene interspersed with the cellulose; and
   wherein the first layer of ink and the second layer of ink are sandwiched between the first layer of substrate and the second layer of substrate, wherein the first layer of ink is arranged between the first layer of substrate and the second layer of ink and wherein the second layer of ink is arranged between the second layer of substrate and the first layer of ink.

2. The multilayer film of claim 1, wherein a thickness of the first layer of ink and a thickness of the second layer of ink is in a range of 1 nanometer to 10 micrometers, and a thickness of the first layer of substrate and a thickness of the second layer of substrate is in a range of 10 micrometers to 500 micrometers.

3. The multilayer film of claim 1, wherein the functional group of the functionalized graphene is at least one of: aliphatic ester, aromatic ester, amine, epoxide, carboxyl, hydroxyl, siloxanes, silanes.

4. The multilayer film of claim 1, wherein a concentration of cellulose is in a range of 0.5 to 20% by weight.

5. The multilayer film of claim 1, wherein the first layer of substrate or the second layer of substrate is polyethylene terephthalate.

6. The multilayer film of claim 1, wherein the first layer of substrate and the second layer of substrate are pre-treated substrates, and the pre-treated substrates and the functionalized graphene comprise a dodecyl-amine functional group.

7. The multilayer film of claim 1, wherein the functionalized graphene and cellulose interspersed was formed by solvent dispersion, wherein the solvent dispersion comprises a binder with a functional group compatible with the functional group of the functionalized graphene.

8. The multilayer film of claim 7, wherein the binder is one of: natural rubber, synthetic rubber, alkane polymer, alkene polymer, polyamide, polyurethane.

* * * * *